US006798299B1

United States Patent
Mar et al.

(10) Patent No.: US 6,798,299 B1
(45) Date of Patent: Sep. 28, 2004

(54) CRYSTAL-LESS OSCILLATOR CIRCUIT WITH TRIMMABLE ANALOG CURRENT CONTROL FOR INCREASED STABILITY

(75) Inventors: Monte Mar, Issaquah, WA (US); Warren Snyder, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/957,084

(22) Filed: Sep. 19, 2001

Related U.S. Application Data

(60) Provisional application No. 60/243,708, filed on Oct. 26, 2000.

(51) Int. Cl.[7] .............................................. H03L 7/093

(52) U.S. Cl. ......................... 331/17; 331/111; 331/176

(58) Field of Search ............................ 331/17, 25, 43, 331/111, 143, 158, 176

(56) References Cited

U.S. PATENT DOCUMENTS

| | | | | |
|---|---|---|---|---|
| 3,940,760 | A | * | 2/1976 | Brokaw ...................... 340/347 |
| 4,138,671 | A | * | 2/1979 | Comer et al. ............... 340/347 |
| 5,202,687 | A | | 4/1993 | Distinti ....................... 341/158 |
| 5,396,245 | A | * | 3/1995 | Rempfer ..................... 341/145 |
| 5,633,766 | A | * | 5/1997 | Hase et al. .................... 331/17 |
| 5,939,949 | A | * | 8/1999 | Olgaard et al. ............... 331/17 |
| 6,144,327 | A | | 11/2000 | Distinti et al. .............. 341/126 |
| 6,157,270 | A | * | 12/2000 | Tso ............................. 331/176 |
| 6,191,660 | B1 | * | 2/2001 | Mar et al. .................... 331/111 |

OTHER PUBLICATIONS

CYPR–CD00196; "A Novel Band–Gap Circuit for Providing an Accurate Reference Voltage Compensated for Process State, Process Variations and Temperature"; Sep. 26, 2001; 09/964,991; Kutz et al.
CYPR–CD00200; "A Microcontroller Having a Dual Mode Relax Oscillator that is Trimmable"; Jul. 24, 2001; 09/912, 768; J. Shutt.

\* cited by examiner

Primary Examiner—Timothy P. Callahan
Assistant Examiner—An T. Luu
(74) Attorney, Agent, or Firm—Wagner, Murabito & Hao LLP

(57) ABSTRACT

A crystal-less oscillator circuit with trimmable current control. In one embodiment, the present invention provides an oscillator circuit comprising a digital to analog converter circuit for generating a current, a band gap reference circuit for generating a voltage, and a relaxation oscillator circuit for creating a frequency based on the current and the voltage. In one embodiment, the digital to analog converter circuit comprises a trimmable current control. In one embodiment, the relaxation oscillator circuit is coupled to a frequency doubler circuit wherein the frequency is passed through the frequency doubler circuit for generating a second frequency. In another embodiment, the present invention provides a phase locked loop circuit comprising a phase detector circuit and the aforementioned oscillator circuit. In another embodiment, the present invention provides a microcontroller comprising a phase locked loop circuit comprising a phase detector circuit and the aforementioned oscillator circuit. The present invention provides an oscillator with stable frequency without the use of a crystal oscillator.

16 Claims, 4 Drawing Sheets

CRYSTAL-LESS OSCILLATOR CIRCUIT WITH TRIMMABLE ANALOG CURRENT CONTROL FOR INCREASED STABILITY

RELATED U.S. APPLICATION

This application claims priority to the provisional patent application, Serial No. 60/243,708, entitled "Advanced Programmable Microcontroller Device," with filing date Oct. 26, 2000, now abandoned, and assigned to the assignee of the present application.

FIELD OF INVENTION

The present invention relates to the field of semiconductor devices. More particularly, the present invention relates to a crystal-less oscillator circuit with trimmable analog current control for providing increased frequency stability.

BACKGROUND OF THE INVENTION

Oscillator circuits are used with digital electronic circuits (e.g., microcontrollers and microprocessors) for a variety of uses including generation of a clock signal for synchronizing, pacing and coordinating the operations of the digital electronic circuit. Some common forms of oscillator circuits are crystal oscillator circuits and voltage controlled oscillators (VCO) circuits.

A crystal oscillator circuit is an oscillator circuit that uses a quartz crystal to generate a frequency. Typical crystal oscillators generate a frequency of substantially 32 KHz. Often, as many applications require a frequency different than 32 KHz (for example 24 MHz or 48 MHz), a phase locked loop circuit is used to lock to a crystal oscillator to a VCO circuit to generate a frequency of a higher accuracy. Crystal oscillator circuits generally output a fixed frequency and are very precise.

A VCO circuit is an oscillator that can be tuned over a wide range of frequencies by applying a voltage (tuning voltage) to it and does not require a crystal. VCOs are typically less costly than crystal oscillators, but not as stable. For example, the frequency generated by a VCO may vary ±20%. Process variation, temperature variation and voltage variation are primarily responsible for this instability.

The required frequency stability of an oscillator depends on the specific application. For example, a computer system in a standard operating mode typically requires a precise frequency while a computer system in a sleep mode typically requires a less precise frequency.

It is desirable to use a crystal-less oscillator where possible for a number of reasons. An oscillator without a crystal requires fewer parts, thus saving room in a system using a microcontroller. Furthermore, requiring fewer parts reduces the cost of the oscillator, thus reducing the cost of the overall system. As many applications do not require the precise timing accorded by a crystal oscillator, it may be beneficial in certain situations to use a crystal-less oscillator.

Currently, there is a large gap between the precision offered by a crystal oscillator and that offered by a voltage controlled oscillator (e.g., a crystal-less oscillator). Applications that require a moderate degree of stability require a crystal oscillator circuit, as current VCO circuits do not offer the stability required.

Furthermore, certain applications only require the stability offered by a crystal oscillator part of the time. It is desirable to have an oscillator that offers an improved degree of precision over current crystal-less oscillators while offering the option of phase locking to an external crystal oscillator for use when a high degree of precision is necessary.

SUMMARY OF THE INVENTION

Accordingly, a need exists for an oscillator circuit that does not require a crystal but still offers an improved degree of frequency stability above current voltage controlled oscillators. A need also exists for an oscillator circuit that satisfies the above need, and allows for stable operation over process variations and temperature variations by having a trimmable current control. A need also exists for an oscillator circuit that satisfies the above needs, and operates in a phase locked loop that can lock to an external crystal for use in applications requiring high precision.

A crystal-less oscillator circuit with trimmable current control is presented. In one embodiment, the present invention provides an oscillator circuit comprising a digital to analog converter circuit for generating a current, a band gap reference circuit for generating a voltage, and a relaxation oscillator circuit for creating a frequency based on the current and the voltage.

In one embodiment, the digital to analog converter circuit comprises a trimmable current control for generating a current. The trimmable current control may comprise a plurality of trimmable components. In one embodiment, the trimmable current control comprises four trimmable components.

In another embodiment, the present invention provides a phase locked loop circuit comprising a phase detector circuit and the aforementioned oscillator circuit. In another embodiment, the present invention provides a microcontroller comprising a phase locked loop circuit comprising a phase detector circuit and the aforementioned oscillator circuit.

The present invention provides an oscillator with stable frequency without the use of a crystal oscillator. The trimmable current control allows for stable operation of the oscillator over process variations, temperature variations and voltage variations. In one embodiment, the oscillator circuit of the present invention operates in a phase locked loop that can lock to an external crystal for use in applications requiring high precision.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
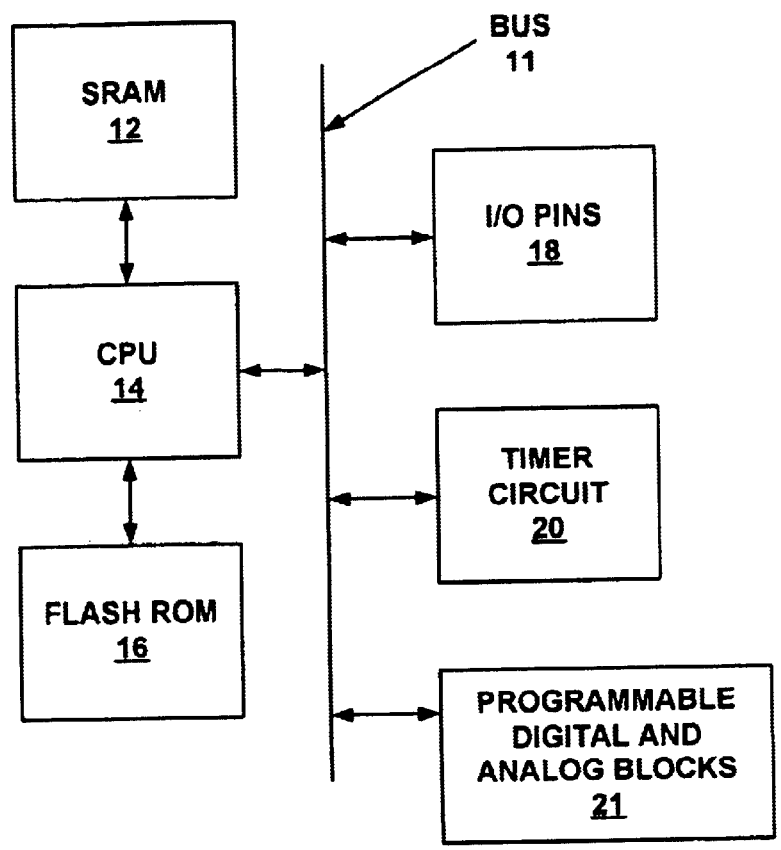
FIG. 1 is a block diagram showing an exemplary digital electronic circuit (or microcontroller) upon which embodiments of the present invention may be implemented.

FIG. 1 is a block diagram showing an exemplary integrated circuit (or microcontroller) 10 upon which embodiments of the present invention may be implemented. Circuit 10 may be implemented on a single die and packaged as a "chip" or IC device. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and timer circuit 20. Timer circuit 20 is further described below. A test interface (not shown) may be coupled to integrated circuit 10 to perform debugging operations during startup and initialization of the integrated circuit. Circuit 10 may also include several programmable analog and digital blocks 21 for implementing functions that are stored in flash ROM 16.

In the present embodiment, flash ROM 16 stores parameters describing microcontroller 10, allowing microcontroller 10 to be programmed during production, during system testing, or in the field. It is contemplated that microcontroller 10 may also be self-programmed remotely. Flash ROM 16 also contains programming for programmable analog and digital blocks 21 while SRAM 12 contains programming for CPU 14.

Timer circuit 20 performs a timing function by generating a clock signal for synchronizing, pacing and coordinating the operations of a microcontroller. In one embodiment, timer circuit 20 is an oscillator circuit with trimmable current control. In another embodiment, timer circuit 20 is a phase locked loop circuit having a voltage controlled oscillator circuit with trimmable current control. In another embodiment, timer circuit 20 is a crystal oscillator circuit.

Figure 2:
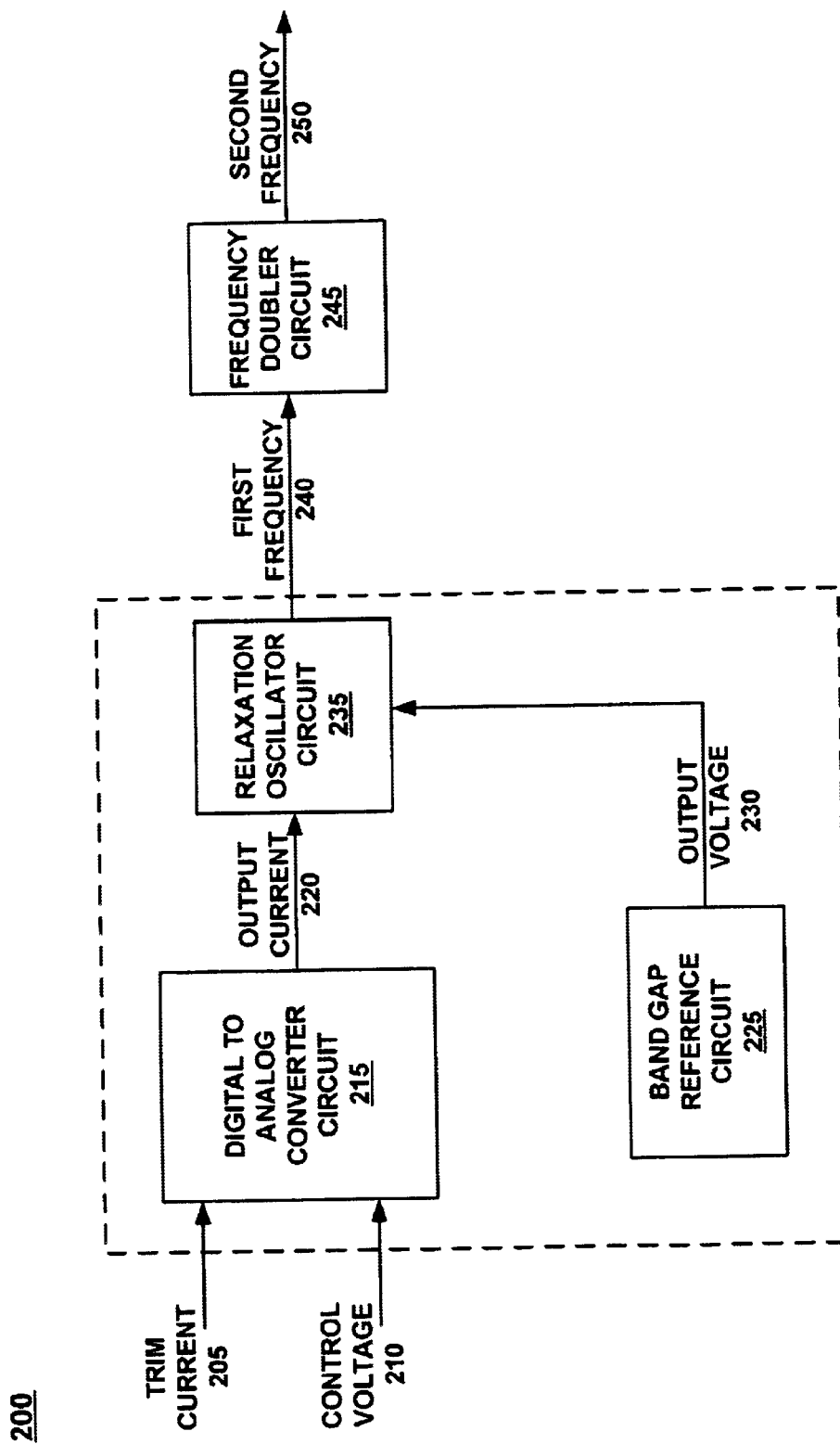
FIG. 2 is a block diagram of an oscillator circuit with trimmable current control in accordance with one embodiment of the present invention.

FIG. 2 is a block diagram of an oscillator circuit 200 with trimmable current control in accordance with one embodiment of the present invention. In one embodiment, oscillator 200 is a voltage controlled oscillator.

In a preferred embodiment, oscillator circuit 200 comprises a digital to analog converter (DAC) circuit 215, a band gap reference circuit 225, and a relaxation oscillator circuit 235. In one embodiment, oscillator 200 is embedded in a phase locked loop architecture coupled to a crystal oscillator. In the present embodiment, oscillator circuit 200 is able to operate by itself (offering a ±2% frequency stability) or by locking to the crystal oscillator to generate a very stable frequency.

In one embodiment, DAC circuit 215 receives a trim current 205 and a control voltage 210 for generating output current 220. In one embodiment, trim current 205 is generated by a trimmable current control. In one embodiment, control voltage 210 is generated at a loop filter circuit (e.g., loop filter circuit 430 of FIG. 4).

Figure 3:
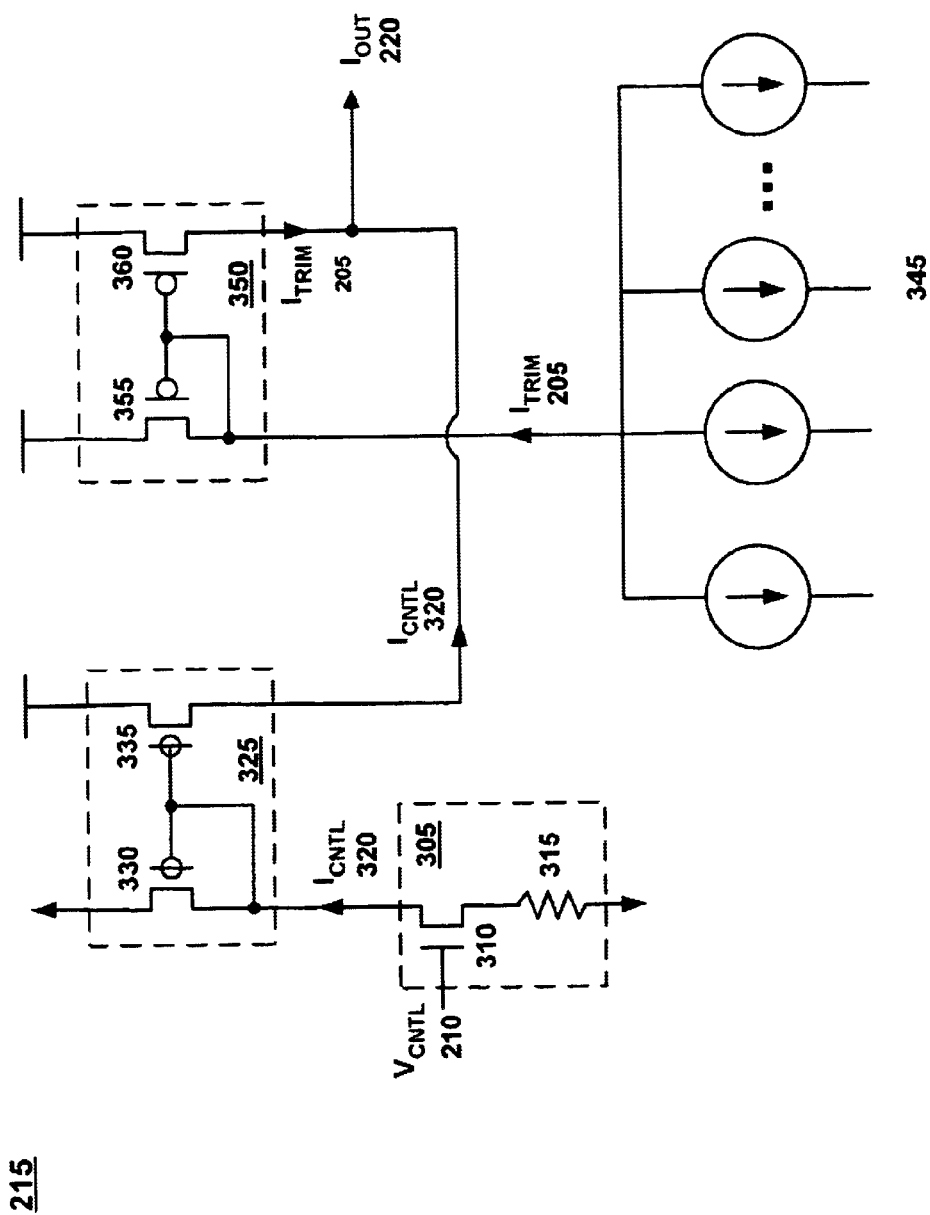
FIG. 3 is a circuit diagram illustrating a digital to analog converter circuit with trimmable components in accordance with one embodiment of the present invention.

FIG. 3 is a circuit diagram illustrating an embodiment of DAC circuit 215 (e.g., digital to analog converter circuit 215 of FIG. 2) with trimmable current control for generating output current 220.

In one embodiment, DAC circuit 215 receives an input of a control voltage ($V_{CNTL}$) 210 at voltage to current converter circuit 305. In one embodiment, control voltage 210 is generated at a loop filter circuit (e.g., loop filter circuit 430 of FIG. 4). Voltage to current converter circuit 305 comprises transistor 310 and resister 315. Voltage to current converter circuit 305 converts control voltage 210 to control current ($I_{CNTL}$) 320.

In one embodiment, DAC circuit 215 comprises current mirror 325, comprising transistor 330 and transistor 335. In one embodiment, transistors 330 and 335 are PMOS transistors. As control current 320 passes through transistor 330, it is mirrored across transistor 335.

DAC circuit 215 comprises a trimmable current control (e.g., trimmable components 345) for generating trim current ($I_{TRIM}$) 205 (e.g., trim current 205 of FIG. 2). In one embodiment, the trimmable current control comprises a plurality of trimmable components 345. In this implementation, the current is trimmed by the introduction of current sources that provide binary adjustable current control. In one embodiment, the trimmable current control comprises four trimmable components. In one embodiment, the trimmable current control is digitally controlled.

In one embodiment, DAC circuit 215 comprises current mirror 350, comprising transistor 355 and transistor 360. In one embodiment, transistors 355 and 360 are PMOS transistors. As trim current 205 passes through transistor 355, it is mirrored across transistor 360.

As shown in Equation 1, after trim current 205 is mirrored across transistor 360, it is added to control current 320, generating output current ($I_{OUT}$) 220.

$$I_{OUT}=I_{CNTL}+I_{TRIM} \qquad \text{Equation 1}$$

Output current 220 is a very stable current (±2%), but does vary to a small degree with process. Trimming the current to the correct value of the desired frequency, by utilizing a trimmable current control (e.g., trimmable components 345), results in a stable current (e.g., output current 220). A trimmable current control accounts for process variation, temperature variation and voltage variation. Also, because trimmable current control allows for setting the value of output current 220, it also allows for the setting of the value of the frequency of oscillation generated by relaxation oscillator circuit 235.

One manner by which the current may be generated is described in U.S. Pat. No. 6,191,660, issued Feb. 20, 2001 by Mar et al., assigned to the assignee of the present invention, and which is being incorporated herein by reference.

Referring now to FIG. 2, band gap reference circuit 225 generates output voltage 230. Output voltage 230 is a very stable voltage, as band gap reference circuit 225 generates output voltage 230 independent of process variations.

Relaxation oscillator 235 receives output current 220 and output voltage 230. Utilizing output current 220 and output voltage 230, relaxation oscillator 235 generates first frequency 240. In one embodiment, relaxation oscillator circuit 235 uses output current into 220 a capacitor to generate a ramp voltage (e.g., a sawtooth waveform). A comparator of relaxation oscillator circuit 235 compares a known reference voltage (e.g., output voltage 230) against the ramp voltage. When the ramp voltage reaches the reference voltage, the comparator switches states, creating a clock signal (e.g., first frequency 240).

It should be appreciated that the frequency of first frequency 240 is controlled by the value of trim current 205, control voltage 210 and output voltage 230.

In one embodiment, frequency doubler circuit 245 is coupled to relaxation oscillator circuit 235 for receiving first frequency 240. Frequency doubler circuit operates to generate a second frequency 250. In one embodiment, second frequency 250 is double the frequency of first frequency 240. For example, in one embodiment first frequency 240 is substantially 24 MHz. Therefore, second frequency 250, upon passing through frequency doubler circuit 245, is substantially 48 MHz.

While oscillator circuit 200 of FIG. 2 provides a very stable frequency for crystal-less oscillators, in particular situations, certain applications may require a very precise frequency that oscillator circuit 200 can not provide. In these situations, it may be desirable to phase lock loop oscillator circuit 200 to a crystal oscillator such that a high precision frequency can be generated for a desired period of time.

Figure 4:
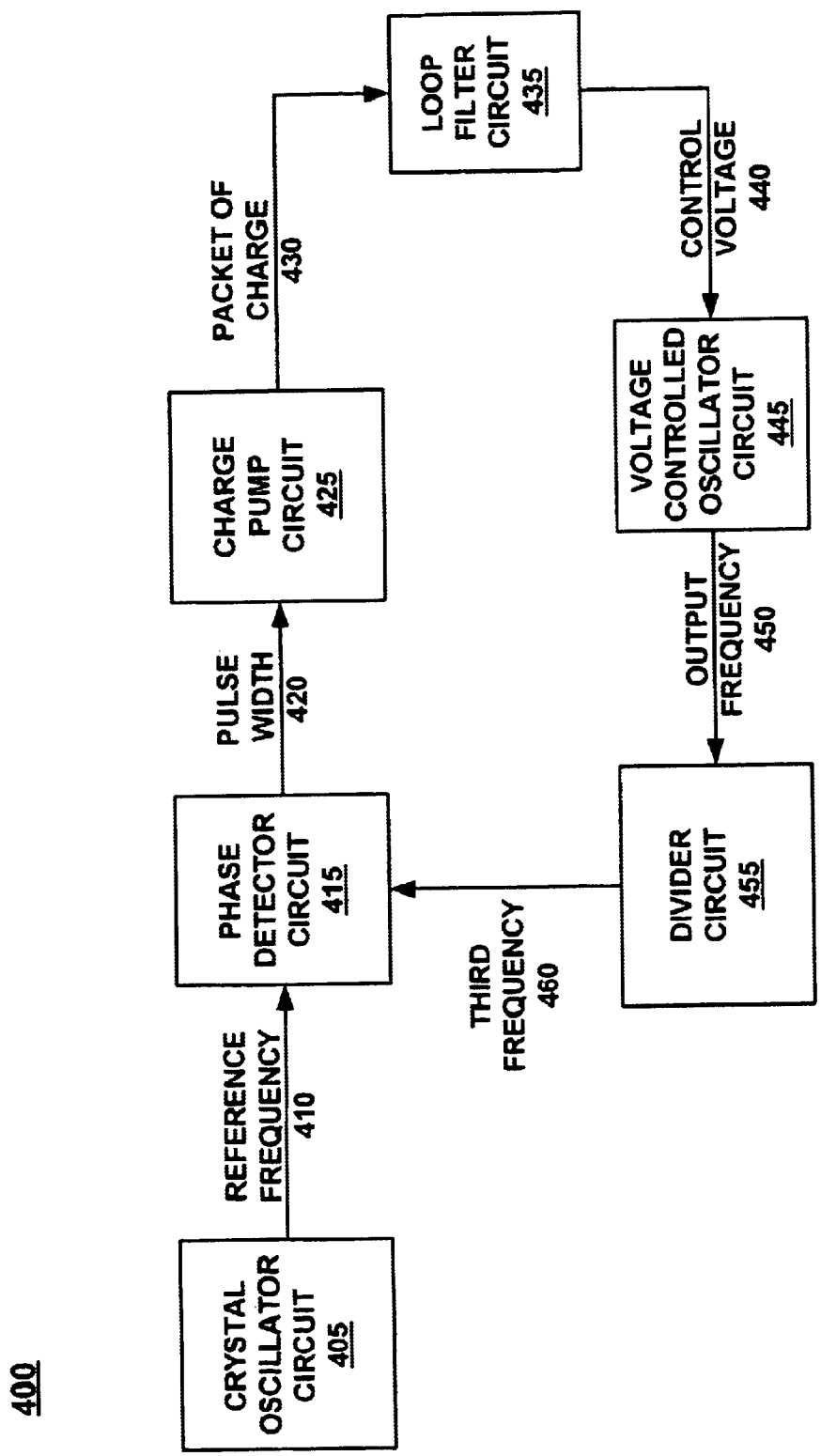
FIG. 4 is a block diagram of a phase locked loop circuit having a voltage controlled oscillator circuit in accordance with one embodiment of the present invention.

FIG. 4 is a block diagram of a phase locked loop circuit 400 having a voltage controlled oscillator circuit 445 in accordance with one embodiment of the present invention. In a typical embodiment, a 32 KHz crystal is used to generate a frequency. However, many applications require a 24 MHz or 48 MHz frequency by which to operate. As such, it is necessary to phase lock a voltage controlled oscillator circuit to a crystal oscillator circuit to generate the desired frequency.

Crystal oscillator circuit 405 generates a reference frequency 410. This reference frequency is a very stable frequency for use in applications where high precision of frequency is required. In one embodiment, reference frequency 410 is substantially 32 KHz.

Phase detector circuit 415 receives reference frequency 410 and third frequency 460 generated at divider circuit 455. Using these frequency inputs, phase detector circuit 415 discriminates the difference in phase between reference frequency 410 and third frequency 460. The difference in phase is output as pulse width 420.

Charge pump circuit 425 receives the pulse width 420. Using pulse width 420, charge pump circuit 425 converts pulse width 420 to a packet of charge 430.

Loop filter 435 receives each packet of charge 430. The respective values of the packets of charge 430 vary from packet to packet. As such, loop filter circuit 435 "smoothes out" the packets of charge by generating an average value of the packets. This average value is output as control voltage 440 (e.g., control voltage 210 of FIGS. 2 and 3).

Voltage controlled oscillator (VCO) circuit 445 receives output voltage 440. In one embodiment, VCO circuit 445 is oscillator 200 of FIG. 2.

VCO circuit 445 generates an output frequency 450 based on output voltage 440 and an output current (e.g., output current 220 of FIGS. 2 and 3). In one embodiment, output frequency 450 is first frequency 240. In another embodiment, where a frequency doubler circuit (e.g., frequency doubler circuit 245 of FIG. 2) is used, output frequency 450 is second frequency 250. In one embodiment, output frequency 450 is substantially 24 MHz. In another embodiment, output frequency 450 is substantially 48 MHz.

In order for phase detector circuit 415 to compare reference frequency 410 to output frequency 450, output frequency 450 must be made equal to reference frequency 410. In a typical embodiment, as explained above, reference frequency 410 is substantially 32 KHz and output frequency 450 is substantially 24 MHz.

Divider circuit 455 receives output frequency 450 for generating third frequency 460. Third frequency 460 is set to be equal to reference frequency 410. As a result, third frequency 460 can be compared to reference frequency 410 at phase detector circuit 415.

Accordingly, the present invention provides an oscillator circuit that may not require a crystal but still offers an improved degree of frequency stability above standard voltage controlled oscillators. The present invention also provides an oscillator circuit that satisfies the above need, and allows for stable operation over process variations and temperature variations by having a trimmable current control. The present invention also provides an oscillator circuit that operates in a phase locked loop that can lock to an external crystal for use in applications requiring high precision.

The preferred embodiment of the present invention, a crystal-less oscillator circuit with trimmable current control, is thus described. While the present invention has been described in particular embodiments, it should be appreciated that the present invention should not be construed as limited by such embodiments, but rather construed according to the below claims.

What is claimed is:

1. An oscillator circuit comprising:
    a digital to analog converter circuit for generating a current and comprising a voltage to current converter circuit for converting a control voltage to a first current and a trimmable current control for generating a second current, wherein said current is a sum of said first current and said second current;
    a band gap reference circuit for generating a voltage based on process variations; and
    a relaxation oscillator circuit coupled to said digital to analog converter circuit and said band gap reference circuit and for generating a frequency based on said current and said voltage.

2. An oscillator circuit as recited in claim 1 further comprising a frequency doubler circuit coupled to said relaxation oscillator circuit wherein said frequency is passed through said frequency doubler circuit for generating a second frequency.

3. An oscillator circuit as recited in claim 1 wherein said trimmable current control comprises a plurality of trimmable components.

4. An oscillator circuit as recited in claim 1 wherein said trimmable current control is digitally controlled.

5. A phase locked loop circuit comprising:
    a phase detector circuit; and
    a voltage controlled oscillator circuit comprising:
        a digital to analog converter circuit for generating a current and comprising a voltage to current converter circuit for converting a control voltage to a first current and a trimmable current control for generating a second current, wherein said current is a sum of said first current and said second current;
        a band gap reference circuit for generating a voltage based on process variations; and
        a relaxation oscillator circuit coupled to said digital to analog converter circuit and said band gap reference circuit and for generating a frequency based on said current and said voltage.

6. A phase locked loop circuit as recited in claim 5 wherein said phase detector circuit is for receiving a reference frequency and discriminating the phase difference between said reference frequency and an output frequency and further comprising:
- a charge pump circuit coupled to said phase detector circuit and for converting said phase difference into a second current;
- a loop filter circuit coupled to said charge pump and said voltage controlled oscillator circuit and for averaging said second current; and
- a divider circuit coupled to said voltage controlled oscillator circuit and said phase detector circuit and for generating said output frequency.

7. A phase locked loop circuit as recited in claim 6 further comprising a crystal oscillator circuit coupled to said phase detector circuit and for generating said reference frequency.

8. A phase locked loop circuit as recited in claim 5 further comprising a frequency doubler circuit coupled to said voltage controlled oscillator circuit wherein said frequency is passed through said frequency doubler circuit for generating a second frequency.

9. A phase locked loop circuit as recited in claim 5 wherein said trimmable current control comprises a plurality of trimmable components.

10. A phase locked loop circuit as recited in claim 5 wherein said trimmable current control is digitally controlled.

11. A microcontroller comprising:
- a bus;
- a processor coupled to said bus;
- a memory unit coupled to said bus;
- a phase locked loop circuit for generating a frequency and coupled to said bus and comprising:
- a phase detector circuit; and
- a voltage controlled oscillator circuit comprising:
  - a digital to analog converter circuit for generating a current and comprising a voltage to current converter circuit for converting a control voltage to a first current and a trimmable current control for generating a second current, wherein said current is a sum of said first current and said second current;
  - a band gap reference circuit for generating a voltage based on process variations; and
  - a relaxation oscillator circuit coupled to said digital to analog converter circuit and said band gap reference circuit for generating a frequency based on said current and said voltage.

12. A microcontroller as recited in claim 11 wherein said phase detector circuit is for receiving a reference frequency and discriminating the phase difference between said reference frequency and an output frequency and further comprising:
- a charge pump circuit coupled to said phase detector circuit and for converting said phase difference into a second current;
- a loop filter circuit coupled to said charge pump and said voltage controlled oscillator circuit and for averaging said second current; and
- a divider circuit coupled to said voltage controlled oscillator circuit and said phase detector circuit and for generating said output frequency.

13. A microcontroller as recited in claim 12 further comprising a crystal oscillator circuit coupled to said phase detector circuit and for generating said reference frequency.

14. A microcontroller as recited in claim 11 further comprising a frequency doubler circuit coupled to said voltage controlled oscillator circuit wherein said frequency is passed through said frequency doubler circuit for generating a second frequency.

15. A microcontroller as recited in claim 11 wherein said trimmable current control comprises a plurality of trimmable components.

16. A microcontroller as recited in claim 11 wherein said trimmable current control is digitally controlled.

* * * * *